United States Patent [19]

Sato

[11] Patent Number: 5,252,500
[45] Date of Patent: Oct. 12, 1993

[54] METHOD OF FABRICATING A SEMICONDUCTOR DEVICE

[75] Inventor: Hiroya Sato, Tenri, Japan

[73] Assignee: Sharp Kabushiki Kaisha, Osaka, Japan

[21] Appl. No.: 843,346

[22] Filed: Feb. 28, 1992

[30] Foreign Application Priority Data

Mar. 4, 1991 [JP] Japan .................. 3-37271

[51] Int. Cl.⁵ .......................... H01L 21/265
[52] U.S. Cl. .................. 437/31; 437/133; 437/228; 437/909; 148/DIG. 11; 148/DIG. 72
[58] Field of Search ............ 437/31, 33, 228, 133, 437/229, 909; 148/DIG. 72, DIG. 100, DIG. 11; 357/34, 16

[56] References Cited

U.S. PATENT DOCUMENTS

| | | | |
|---|---|---|---|
| 4,593,457 | 6/1986 | Birrittella | 437/31 |
| 4,954,457 | 9/1990 | Jambotkar | 437/228 |
| 5,093,272 | 3/1992 | Hoepfner et al. | 437/31 |

FOREIGN PATENT DOCUMENTS

| | | | |
|---|---|---|---|
| 0138774 | 6/1988 | Japan | 437/31 |
| 0030269 | 2/1989 | Japan | 437/31 |
| 0090626 | 3/1990 | Japan | 437/31 |

OTHER PUBLICATIONS

Masanori Inada et al, "AlGaAs/GaAs Heterojunction Bipolar Transistors with Small Size Fabricated by a Multiple Self-Alignment Process Using One Mask" IEEE Transactions on Electron Devices, vol. ED-34, No. 12, Dec. 1987, pp. 2405-2411.

*Primary Examiner*—Brian E. Hearn
*Assistant Examiner*—Tuan Nguyen

[57] ABSTRACT

There is provided a method of fabricating a semiconductor device. This method includes the steps of: forming a collector layer, a base layer, an emitter layer, and a dummy layer; patterning the dummy layer and the emitter layer into a mesa structure; forming a base electrode on the base layer in self-alignment to the mesa structure, and simultaneously forming a base electrode material on the dummy layer; forming a surface planarization film on the base layer to cover sides of the mesa structure; and removing the base electrode material and the dummy layer. The removal of the dummy layer is performed by subjecting the dummy layer to an etchant through an opening in the base electrode material.

6 Claims, 3 Drawing Sheets

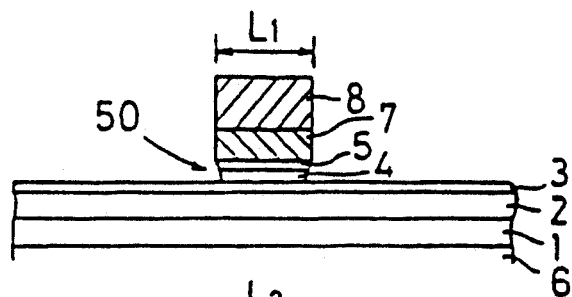
FIG. IA
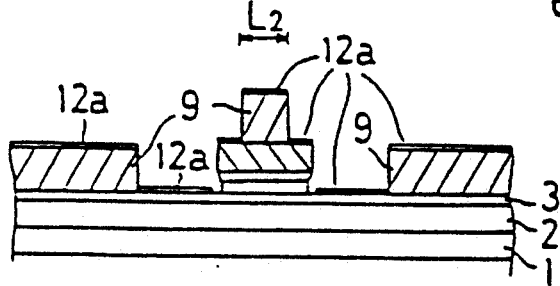
FIG. IB
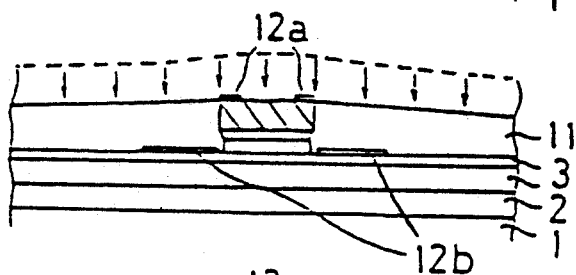
FIG. IC
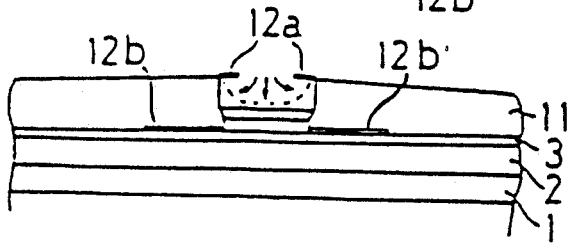
FIG. ID
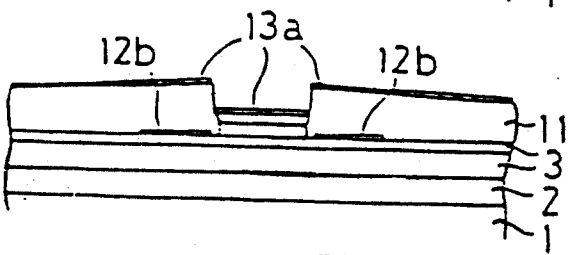
FIG. IE
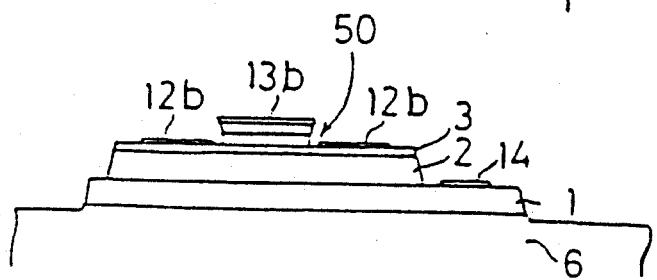
FIG. IF

METHOD OF FABRICATING A SEMICONDUCTOR DEVICE

BACKGROUND OF THE INVENTION

1. Field of the Invention

This invention relates to a method of fabricating a semiconductor device, and more particularly to a method of fabricating a semiconductor device, suitable for the fabrication of a heterojunction bipolar transistor.

2. Description of the Prior Art

FIG. 3 shows a cross section of a heterojunction bipolar transistor. The heterojunction bipolar transistor shown has a layered structure consisting of a sub-collector layer 1, a collector layer 2, a base layer 3, an emitter layer 4, and an emitter contact layer 5, the layers being formed one on top of another on a semiconductor substrate 6 in the order named.

On the upper surface of the base layer 3 are formed an emitter mesa 50 having a mesa structure and a base electrode 12b. The base electrode 12b is disposed adjacent to the side wall of the emitter mesa 50 with a gap of about 100 nm provided therebetween. An emitter electrode 13 is formed on top of the emitter contact layer 5, while a collector electrode 14 is provided on the sub-collector layer 1.

Referring now to FIGS. 2A to 2C, we will describe a prior art method for the fabrication of the heterojunction bipolar transistor shown in FIG. 3. The prior art method described below involves self-aligning the base electrode 12b to the sidewall of the emitter layer 7 having a mesa structure. This method permits high-density integration of bipolar transistors and lends itself to increasing the speed of transistor operation.

As shown in FIG. 2A, a sub-collector layer 1, a collector layer 2, a base layer 3, an emitter layer 4, and an emitter contact layer 5 are grown one on top of another on a semiconductor substrate 6 using an epitaxial growth technique. After that, a dummy layer 7 is deposited on the emitter contact layer 5. The dummy layer 7 will be removed in the end and will not be used to form the heterojunction bipolar transistor. After patterning the dummy layer 7 in the form of a mesa, the emitter contact layer 5 and the emitter layer 4 are etched, using the patterned dummy layer 7 as the etching mask, to form an emitter mesa 50 while exposing a portion of the base layer 3.

Next, as shown in FIG. 2B, using the dummy layer 7 and a resist pattern 19 as the mask, a base electrode material 12a is deposited on the exposed portion of the base layer 3 as well as on the mask.

By removing the resist pattern 19 and the unwanted base electrode material 12a deposited thereon, a base electrode 12b can be formed in self-alignment to the sidewall of the emitter mesa 50 (FIG. 2C). At this step, however, the base electrode material 12a remains unremoved on the dummy layer 7.

Next, a surface planarization resist (surface smoothing film) 21 is applied over the semiconductor substrate 6 in such a manner as to cover the dummy layer 7, the base electrode material 12a remaining thereon, etc. In the subsequent etch-back process using a dry etching technique, the surface planarization resist 21 is uniformly etched from the surface thereof, thereby exposing a portion of the dummy layer 7 and the base electrode material 12a deposited thereon (FIG. 2C).

Next, using a wet etching technique, the dummy layer 7 is etched away, as a result of which the base electrode material 12a on the dummy layer 7 is lifted off. An emitter electrode material is then deposited over the entire upper surfaces of the emitter contact layer 5 and the surface planarization resist, after which the surface planarization resist and the unwanted emitter electrode material deposited thereon are removed by a lift-off technique, thereby forming an emitter electrode 13 on top of the emitter contact layer 5. Thereafter, using a known technique, selected portions of the base layer 3, collector layer 2, and sub-collector layer 1 are etched away to form a collector electrode 14 on the sub-collector layer 1, thus completing the fabrication of the heterojunction bipolar transistor shown in FIG. 3.

However, in the above prior art process, the upper surface of the dummy layer 7 is completely covered with the base electrode material 12a, as shown in FIG. 2C, when etching the dummy layer 7. Therefore, in order to remove the dummy layer 7 by etching, the etchant must be applied to the dummy layer 7 through an overetched portion 15 in the surface planarization resist 21. Such a method requires a relatively long etching time (e.g., about 10 minutes) to etch away the dummy layer 7 and remove the base electrode material 12a on the dummy layer 7. A long etching time may result in the stripping of the surface planarization resist 21. Since the surface planarization resist 21 is usually composed of organic resist, if it suffers plasma damage during the dry etching in the etchback process, etc., it will lose resistance to the etchant (e.g., buffered hydrofluoric acid) applied to the dummy layer 7. If stripping is caused to the surface planarization resist 21 during the process of removing the dummy layer 7 by etching, deposition of emitter metal may cause a short circuit between the base and the emitter. As a result, the prior art has had difficulty in producing heterojunction bipolar transistors with high fabrication yield.

SUMMARY OF THE INVENTION

The method of fabricating a semiconductor device, which overcomes the above-discussed and numerous other disadvantages and deficiencies of the prior art, comprises the steps of: forming a collector layer of a first conductivity type over a semiconductor substrate; forming a base layer of a second conductivity type on said collector layer; forming an emitter layer of the second conductivity type on said base layer; forming a dummy layer on said emitter layer; patterning said dummy layer and said emitter layer into a mesa structure which is formed on said base layer; forming a base electrode on said base layer in self-alignment to said mesa structure, and simultaneously forming a base electrode material on said dummy layer of said mesa structure, said base electrode material having an opening for exposing a portion of a top surface of said dummy layer; forming a surface planarization film on said base layer to cover sides of said mesa structure; removing said base electrode material and said dummy layer of said mesa structure by subjecting said dummy layer to an etchant through said opening, thereby exposing a top surface of said emitter layer; and forming an emitter electrode on said top surface of said emitter layer by a lift-off technique using said surface planarization film.

In a preferred embodiment, width of a top surface region which is covered with said base electrode material is less than twice the thickness of said dummy layer.

In a preferred embodiment, said collector layer includes a sub-collector layer which is formed on said semiconductor layer.

In a preferred embodiment, said emitter layer includes an emitter contact layer.

According to the present invention, a method of fabricating a semiconductor device is provided, which comprises the steps of: forming an emitter layer of a first conductivity type over a semiconductor substrate; forming a base layer of a second conductivity type on said emitter layer; forming a collector layer of the second conductivity type on said base layer; forming a dummy layer on said collector layer; patterning said dummy layer and said collector layer into a mesa structure which is formed on said base layer; forming a base electrode on said base layer in self-alignment to said mesa structure, and simultaneously forming a base electrode material on said dummy layer of said mesa structure, said base electrode material having an opening for exposing a portion of a top surface of said dummy layer; forming a surface planarization film on said base layer to cover sides of said mesa structure; removing said base electrode material and said dummy layer of said mesa structure by subjecting said dummy layer to an etchant through said opening, thereby exposing a top surface of said collector layer; and forming a collector electrode on said top surface of said collector layer by a lift-off technique using said surface planarization film.

In a preferred embodiment, the width of a top surface region which is covered with said base electrode material is less than twice the thickness of said dummy layer.

Thus, the invention described herein makes possible the objectives of (1) providing a method of fabricating a semiconductor device whereby the surface planarization resist is less susceptible to stripping during the etching of the dummy layer; (2) providing a method of fabricating a semiconductor device with an increased yield; and (3) providing a method of fabricating a semiconductor device which permits a relatively wide choice of etching conditions such as etchant, etching time, etc. for removal of the dummy layer as well as the kind, thickness, etc. of the dummy layer.

BRIEF DESCRIPTION OF THE DRAWINGS

This invention may be better understood and its numerous objects and advantages will become apparent to those skilled in the art by reference to the accompanying drawings as follows:

FIGS. 1A to 1F show a method for the fabrication of a heterojunction bipolar transistor according to the present invention;

DESCRIPTION OF THE PREFERRED EMBODIMENTS

Figure 2A:
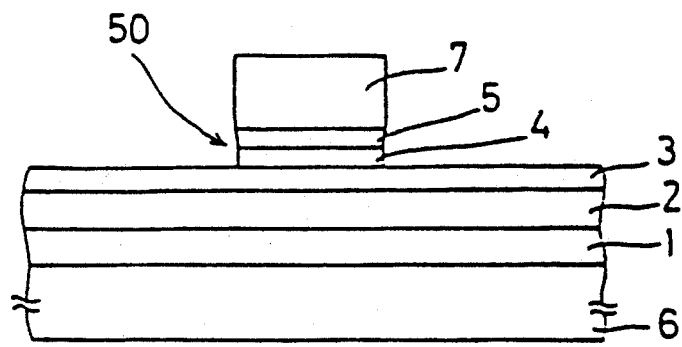
FIGS. 2A to 2C show a prior art method for the fabrication of a heterojunction bipolar transistor.
Figure 2B:
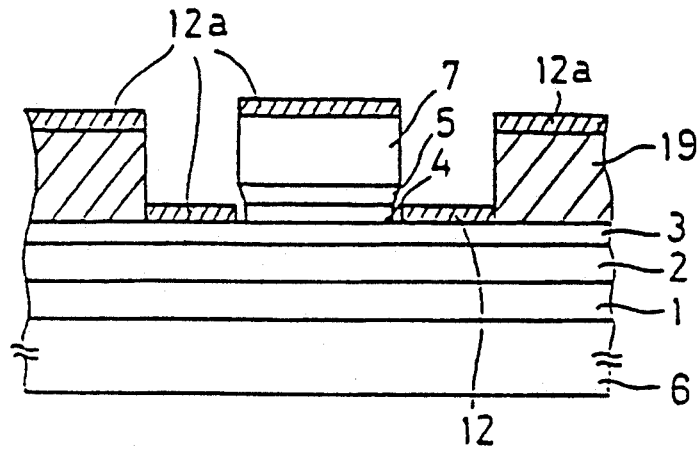
Figure 2C:
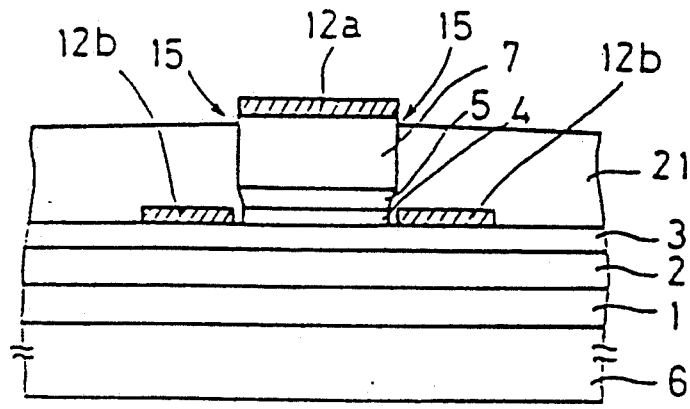
Figure 3:
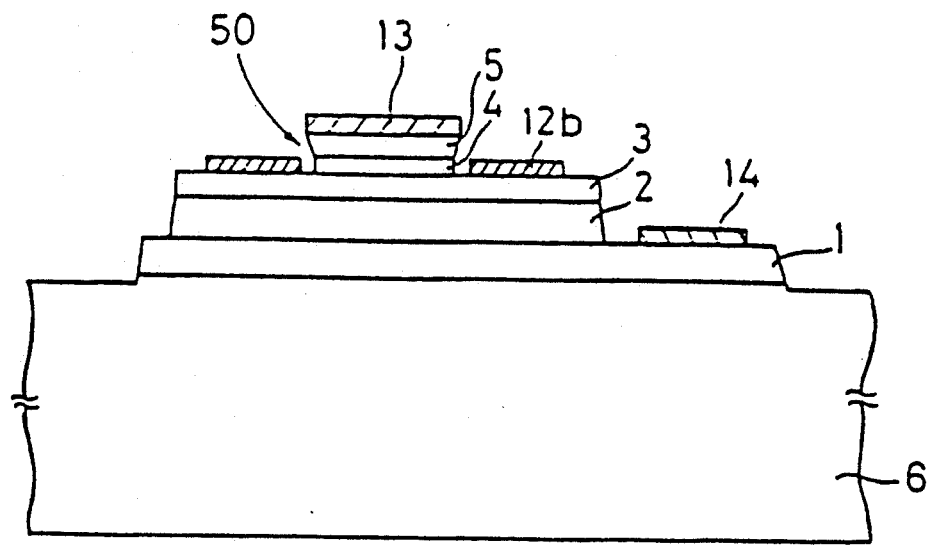
FIG. 3 shows a cross section of a heterojunction bipolar transistor.

A preferred embodiment of the present invention will now be described with reference to FIGS. 1A through 1F.

First, a Si-doped n+-type GaAs sub-collector layer 1 (Si concentration=$4 \times 10^{18}$ cm$^{-3}$, thickness=500 nm), a Si-doped n-type GaAs collector layer 2 (Si concentration=$5 \times 10^{15}$ cm$^{-3}$, thickness=500 nm), a Be-doped p-type GaAs base layer 3 (Be concentration=$1 \times 10^{19}$ cm$^{-3}$, thickness=100 nm), a Si-doped n-type AlGaAs emitter layer 4 (Si concentration=$2 \times 10^{17}$ cm$^{-3}$, thickness=150 nm), and a Si-doped n-type GaAs emitter contact layer 5 (Si concentration=$5 \times 10^{18}$ cm$^{-3}$, thickness=150 nm) are grown one on top of another on a semiconductor GaAs substrate 6 using an epitaxial growth technique.

The n+-type GaAs sub-collector layer 1 and the n-type GaAs collector layer 2 together form the collector (the first semiconductor layer) of the bipolar transistor to be fabricated by the method of this embodiment. The n+-type GaAs sub-collector layer 1 serves as a highly doped layer that provides a highly ohmic contact with a collector electrode 14 (see FIG. 1F). The base (the second semiconductor layer) is formed from the p-type GaAs base layer 3. The emitter (the third semiconductor layer) is formed from the n-type AlGaAs emitter layer 4 and the n+-type GaAs emitter contact layer 5. The n+-type GaAs emitter contact layer 5 serves as a highly doped layer that provides an ohmic contact with an emitter electrode 13.

A dummy layer 7 (500 nm thickness) formed from a silicon nitride film is deposited by plasma CVD on the n+-type GaAs emitter contact layer 5. A resist pattern 8 (width L1=2 $\mu$m) is then formed on the dummy layer 7 by a photolithography technique using a stepper. After that, using the resist pattern 8 as the etching mask, the dummy layer 7 is patterned into a prescribed shape by an RIE (a reactive ion etching). Thereafter, using a phosphoric acid etchant, the n+-type GaAs emitter contact layer 5 and the n-type AlGaAs emitter layer 4 are etched to form an emitter mesa 50 on the p-type GaAs base layer 3, as shown in FIG. 1A. In this specification, the emitter mesa 50 and the dummy layer 7 formed thereon are collectively referred to as the emitter structure.

As shown in FIG. 1B, after removing the resist pattern 8, a resist pattern 9 is formed on the dummy layer 7 as well as on the p-type GaAs base layer 3 by a photolithography technique using a stepper. The resist pattern 9 is provided to lift off a base electrode material 12a subsequently deposited. The two-dimensional pattern of the resist pattern 9 defines an area in which to form a base electrode 12b on the p-type GaAs base layer 3 and an area in which to deposit the base electrode material 12a on the dummy layer 7. To describe the two-dimensional pattern of the resist pattern 9 in more detail, the portion of the resist pattern 9 formed on the dummy layer 7 does not completely cover the upper surface of the dummy layer 7 but leaves a portion thereof exposed. The width L2 of the portion of the resist pattern 9 formed on the dummy layer 7 is 1 $\mu$m.

Next, as shown in FIG. 1B, the base electrode material 12a (Au/Zn) is deposited over the semiconductor GaAs substrate 6 in such a manner as to cover the surface of the resist pattern 9. To describe in more detail, the base electrode material 12a is deposited on the surface of the resist pattern 9, the surface portion of the p-type GaAs base layer 3 not covered by the resist 9, and the surface portion of the dummy layer 7 not covered by the resist 9. Thereafter, using a lift-off technique, the resist pattern 9 and the unwanted base electrode material 12a deposited thereon are removed. As a result, the base electrode 12b is formed on the p-type GaAs base layer 3 in self-alignment to the sidewall face of the emitter mesa 50. At the same time, a base electrode material pattern having an opening of 1 $\mu$m width in its center is formed on the dummy layer 7. The width of the opening is approximately equal to the width L2.

After applying a surface planarization resist 11 over the p-type GaAs base layer 3 in such a manner as to cover the mesa structure, the surface planarization resist 11 is etched from the surface thereof in an etchback process using an oxygen-base etching gas. As shown in FIG. 1C, the etching is carried out until the base electrode material 12a deposited on the dummy layer 7 is exposed.

Next, the semiconductor GaAs substrate 6 is dipped in a 0.5% solution of buffered hydrofluoric acid for 80 seconds to etch away the dummy layer 7. As shown in FIG. 1D, at this time, the base electrode material 12a remaining on the dummy layer 7 is also removed by lift-off (FIG. 1D). It has been found that the time needed to completely remove this dummy layer 7 is approximately equal to the time needed to etch away a dummy layer (a silicon nitride film of 500 nm thickness), not covered by the base electrode material 12a, using a 0.5% solution of buffered hydrofluoric acid. This is because, in the above embodiment, the provision of the opening in the base electrode material 12a deposited on the dummy layer 7 serves to ensure sufficient contact between the 0.5% buffered hydrofluoric acid solution and the dummy layer 7, thus facilitating the effective etching of the dummy layer 7.

As a result of an experiment conducted by the inventor, it has been found that, when the width of the area on the dummy layer 7 covered by the base electrode material 12a (the width being substantially equal to the result of subtraction of width L2 from width L1) is set at a value not greater than two times the thickness of the dummy layer 7, the time needed to etch away the dummy layer 7 is approximately equal to the time needed to etch away a dummy layer (a silicon nitride film of 500 nm thickness) not covered by the base electrode material 12a. Accordingly, from the standpoint of reducing the etching time, it is desirable that the width of the area on the dummy layer 7 covered by the base electrode 12a be set at a value not greater than two times the thickness of the dummy layer 7.

After depositing an emitter electrode material 13a on the surface planarization resist 11 and the n+-type GaAs emitter contact layer 5, as shown in FIG. 1C, an emitter electrode 13b is formed on the n+-type GaAs emitter contact layer 5 using a lift-off technique. Designated portions of the p-type GaAs base layer 3 and n-type GaAs collector layer 2 are then etched away by photolithography and etching using a phosphoric acid etchant, thereby shaping the p-type GaAs base layer 3 into a mesa-structured base region.

As a collector electrode material, AuGe/Ni/Au is deposited on a designated portion of the n+-type GaAs sub-collector 1 to form a collector electrode (FIG. 1F). Thereafter, heat treatment is performed in a hydrogen atmosphere (at 330° C. for 10 seconds) to alloy the electrodes, thus completing the fabrication of the self-aligned heterojunction bipolar transistor as shown in FIG. 1F.

Thus, according to the fabrication method of the present invention, since the surface planarization resist 11 is less susceptible to stripping during the etching of the dummy layer 7, self-aligned heterojunction bipolar transistors can be fabricated with high yield and without substantially increasing the number of processing steps.

The present invention permits a relatively wide choice of etching conditions such as etchant, etching time, etc. for removal of the dummy layer 7 as well as the kind, thickness, etc. of the dummy layer, thus providing a greater margin for the fabrication process.

The fabrication method of the present invention is also suitable for the fabrication of heterojunction bipolar transistors of other lattice alignment types (e.g., InGaAs/InAlAs type, InGaAs/InP type, etc.) than the type described in the above embodiment.

Furthermore, the fabrication method of the present invention can be applied to the fabrication not only of the so-called single heterojunction bipolar transistor in which the emitter layer has a relatively wide band gap but also of the so-called double heterojunction bipolar transistor in which the collector layer also has a wide band gap.

The fabrication process may include a step of reducing $C_{bc}$ (base-collector capacitance) by implanting ions, such as oxygen ions, boron ions, or hydrogen ions, into an external base. Also, ion implantation may be performed to form isolating regions to isolate the individual components from each other. It is easy in terms of fabrication technology to combine these methods with the method of the present invention. Accordingly, the method of the present invention is suitable for the fabrication of high-speed transistors with reduced $C_{bc}$ (base-collector capacitance).

In the above embodiment, the collector, the base, and the emitter are grown on the semiconductor substrate in the order named, but these layers may be grown on the substrate in the reverse order. In the latter case, the collector (collector mesa) forms a mesa structure. Furthermore, the conductivity types of the semiconductor layers may be reversed from those described in the above embodiments. Also, the step of growing the sub-collector layer 1 using a conductive substrate may be omitted. In this case, contacts with the electrodes are formed on the conductive substrate.

According to the present invention, the surface planarization film is less susceptible to stripping during the etching of the dummy layer, and therefore, semiconductor devices can be fabricated with high yield. Accordingly, the present invention achieves the fabrication of self-aligned heterojunction bipolar transistors with high yield and without substantially increasing the number of processing steps, which serves to increase the productivity and reduce the production cost.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a semiconductor device, comprising the steps of:
    forming a collector layer of a first conductivity type over a semiconductor substrate;
    forming a base layer of a second conductivity type on said collector layer;
    forming an emitter layer of the second conductivity type on said base layer;
    forming a dummy layer on said emitter layer;

patterning said dummy layer and said emitter layer into a mesa structure which is formed on said base layer;

forming a base electrode on said base layer in self-alignment to said mesa structure, and simultaneously forming a base electrode material on said dummy layer of said mesa structure, said base electrode material having an opening for exposing a portion of a top surface of said dummy layer;

forming a surface planarization film on said base layer to cover sides of said mesa structure;

removing said base electrode material and said dummy layer of said mesa structure by subjecting said dummy layer to an etchant through said opening, thereby exposing a top surface of said emitter layer; and forming an emitter electrode on said top surface of said emitter layer by lift-off technique using said surface planarization film.

2. A method according to claim 1, wherein the width of a top surface region which is covered with said base electrode material is less than twice the thickness of said dummy layer.

3. A method according to claim 1, wherein said collector layer includes a sub-collector layer which is formed on said semiconductor layer.

4. A method according to claim 1, wherein said emitter layer includes an emitter contact layer.

5. A method of fabricating a semiconductor device, comprising the steps of:

forming an emitter layer of a first conductivity type over a semiconductor substrate;

forming a base layer of a second conductivity type on said emitter layer;

forming a collector layer of the second conductivity type on said base layer;

forming a dummy layer on said collector layer;

patterning said dummy layer and said collector layer into a mesa structure which is formed on said base layer;

forming a base electrode on said base layer in self-alignment to said mesa structure, and simultaneously forming a base electrode material on said dummy layer of said mesa structure, said base electrode material having an opening for exposing a portion of a top surface of said dummy layer;

forming a surface planarization film on said base layer to cover the sides of said mesa structure;

removing said base electrode material and said dummy layer of said mesa structure by subjecting said dummy layer to an etchant through said opening, thereby exposing a top surface of said collector layer; and forming a collector electrode on said top surface of said collector layer by a lift-off technique using said surface planarization film.

6. A method according to claim 5, wherein the width of a top surface region which is covered with said base electrode material is less than twice the thickness of said dummy layer.

* * * * *